(12) United States Patent
Dupont et al.

(10) Patent No.: US 8,472,493 B2
(45) Date of Patent: Jun. 25, 2013

(54) HYBRID LASER COUPLED TO A WAVEGUIDE

(75) Inventors: Tiphaine Dupont, Grenoble (FR); Laurent Grenouillet, Rives (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 288 days.

(21) Appl. No.: 12/974,544

(22) Filed: Dec. 21, 2010

(65) Prior Publication Data

US 2011/0150024 A1    Jun. 23, 2011

(30) Foreign Application Priority Data

Dec. 21, 2009   (FR) ...................................... 09 59301

(51) Int. Cl.
*H01S 3/08*   (2006.01)
*H01S 5/00*   (2006.01)

(52) U.S. Cl.
USPC ............................. 372/50.11; 372/92; 372/96

(58) Field of Classification Search
USPC ............................. 372/50.11, 92, 94, 102, 96
See application file for complete search history.

(56) References Cited

U.S. PATENT DOCUMENTS

2009/0154517 A1    6/2009 Leem
2011/0243496 A1*  10/2011 Jones .............................. 385/14

FOREIGN PATENT DOCUMENTS

FR    2909491 A1   6/2008

OTHER PUBLICATIONS

"French Search Report" issued Jul. 28, 2010 for French Patent Application Serial No. 09/59301.
"Facetless Bragg Reflector Surface-emitting AlGAAs/GaAs Lasers Fabricated by Electron-Beam Lithography and Chemically Assisted Ion-Beam Etching", Tiberio R.C., et al., Journal of Vacuum Science and Technology, USA, vol. 9, No. 6, Nov. 1191 pp. 2842-2845 XP002594026.
"Monolithically Integrated Transverse-Junction-Stripe Laser with an External Waveguide in GaAs/AlGaAs", Vawter, G.A., et al. IEEE Journal of Quantum Electronics USA, vol. 25, No. 2, (Feb. 1989), pp. 154-162, XP002594027.

* cited by examiner

*Primary Examiner* — Armando Rodriguez
(74) *Attorney, Agent, or Firm* — Vedder Price P.C.

(57) ABSTRACT

A method for introducing light into a waveguide formed on the upper surface of a microelectronics substrate, by means of a distributed feedback laser device formed by the association of an SOI-type structure having a portion forming said waveguide, of a stack of III-V semiconductor gain materials partially covering the waveguide, and of an optical grating, wherein the grating step is selected so that the optical power of the laser beam circulates in a loop from the III-V stack to the waveguide.

5 Claims, 2 Drawing Sheets

HYBRID LASER COUPLED TO A WAVEGUIDE

The present invention relates to integrated circuits combining microelectronic and photonic circuits, and more specifically to integrated circuits on silicon, and more specifically still to the injection of single-mode coherent light into an integrated circuit waveguide by a hybrid laser.

In the field of microelectronics, the integration density increase is such that it raises issues. In particular, the frequency of integrated circuits is beginning to be limited by electric interconnects, and the power to be dissipated per surface area unit in the form of heat in such interconnects is beginning to curb the performance increase.

A solution envisaged to overcome these issues is to replace the upper electric interconnect levels with optical interconnects, with a better bandwidth performance and less power consumption, such optical interconnects being intimately integrated to the silicon of microelectronic circuits.

However, although silicon can be very advantageously used for the manufacturing of passive optical components, it has the disadvantage of being a very poor light emitter. Indeed, its electronic band structure does not allow direct radiative transitions. The integration of a laser on silicon thus requires arranging a multilayer stack of III-V semiconductors (for example, GaAs or InP families and their associated alloys) on a silicon wafer, for example, of silicon-on-insulator type (SOI).

The arrangement of III-V structures on SOI is performed by molecular bonding (via an $SiO_2$ layer) or by adhesive bonding (via a polymer layer).

The case where the laser cavity is of DFB type (Distributed FeedBack), that is, the case of a laser where the resonator comprises a periodic structure which acts as a wavelength-selective reflector, distributed along the gain material, will more specifically be considered herein. This type of laser is described in many publications, for example in US patent application 2004/0004217.

As illustrated in FIGS. 1 and 2, this type of structure comprises an SOI-type substrate comprising on a support 1, generally a silicon wafer, a thin insulating layer 2, generally silicon oxide, and a thin single-crystal or amorphous silicon layer 3. The surface of silicon layer 3 comprises a periodic structure defining a grating 9. On this substrate, a planar III-V semiconductor multilayer stack 5 for example comprising an N-type doped InP layer 6, an intrinsic InGaAsP layer containing one or several quantum wells, and a P-type doped InP layer 8 are arranged, with a possible interposed interface layer 4. III-V stack 5 is associated with biasing electrodes, not shown. Several means are known to arrange such a structure on the upper surface of an SOI-type substrate.

III-V stack 5 is a gain-guiding structure, having the function of generating photons. Silicon layer 3 is a passive SOI waveguide having the function of collecting the photons generated in the III-V stack and of guiding them beyond the area covered by the stack, all the way to the different circuit devices. The function of grating 9 is to behave as a distributed reflector, enabling the photons to cross the gain area several times. The laser component is defined by the reunion of III-V stack 5 (gain area), of the SOI waveguide (external coupler), and of grating 9 (reflector). It is a hybrid III-V/Si laser.

With such a structure and according to its optical index distribution, the laser mode is mainly guided either in III-V stack 5 as shown in FIG. 1, or in silicon layer 3, as shown in FIG. 2. In the first case, the modal gain is favored over the efficiency of power extraction towards silicon waveguide 3. In the second case, the efficiency of power extraction towards silicon waveguide 3 is favored over the modal gain.

A disadvantage of this type of structure and of its variations is that it imposes a compromise between the laser threshold and the power collected in silicon waveguide 3.

An object of the present invention is to improve this type of structure, and more specifically to allow both a low laser threshold and a high power collected in silicon waveguide 3.

To achieve these objects, an embodiment of the present invention provides a method for introducing light into a waveguide formed on the upper surface of a microelectronics substrate, by means of a distributed feedback laser device formed by the association of an SOI-type structure having a portion forming said waveguide, of a stack of III-V semiconductor gain materials partially covering the waveguide, and of an optical grating, wherein the grating step is selected so that the optical power of the laser beam circulates in a loop from the III-V stack to the waveguide.

According to an embodiment of the present invention, the grating step is selected so that:

$$\beta_{SOI}(\omega_2)+\beta_{III-V}(\omega_2)=2n\pi/a, \text{ and}$$

$$\beta_{SOI}(\omega_2) \neq \beta_{III-V}(\omega_2)$$

with:
a: grating step,
$\omega_2$: mode frequency,
$\beta_{SOI}$: propagation constant in the waveguide,
$\beta_{III-V}$: propagation constant in said stack,
n: an integer.

According to an embodiment of the present invention, the grating length is selected so that:

$$R=\tanh^2(2\kappa L)$$

with:
L: grating length,
κ: contradirectional coupling constant,
R: grating reflectivity
so that R ranges between 0.60% and 0.99%.

An embodiment of the present invention provides a distributed feedback laser device formed by the association of an SOI-type structure having a portion forming a waveguide, of a stack of III-V semiconductor gain materials partially covering the waveguide, and of an optical grating having its period selected to allow a loop circulation of the optical power from the III-V stack to the waveguide.

According to an embodiment of the present invention, the grating is formed of periodic recesses dug into the upper surface of a silicon waveguide clad with silicon oxide.

According to an embodiment of the present invention, the grating step is selected so that:

$$\beta_{SOI}(\omega_2)+\beta_{III-V}(\omega_2)=2na, \text{ and}$$

$$\beta_{SOI}(\omega_2) \neq \beta_{III-V}(\omega_2)$$

with:
a: grating step,
$\omega_2$: mode frequency,
$\beta_{SOI}$: propagation constant in the waveguide,
$\beta_{III-V}$: propagation constant in said stack,
n: an integer.

According to an embodiment of the present invention, the grating length is selected so that:

$$R=\tanh^2(2\kappa L)$$

with:
- L: laser length,
- κ: contradirectional coupling constant,
- R: grating reflectivity so that R ranges between 0.60% and 0.99%.

The foregoing and other objects, features, and advantages of the present invention will be discussed in detail in the following non-limiting description of specific embodiments in connection with the accompanying drawings.

Figure 1:
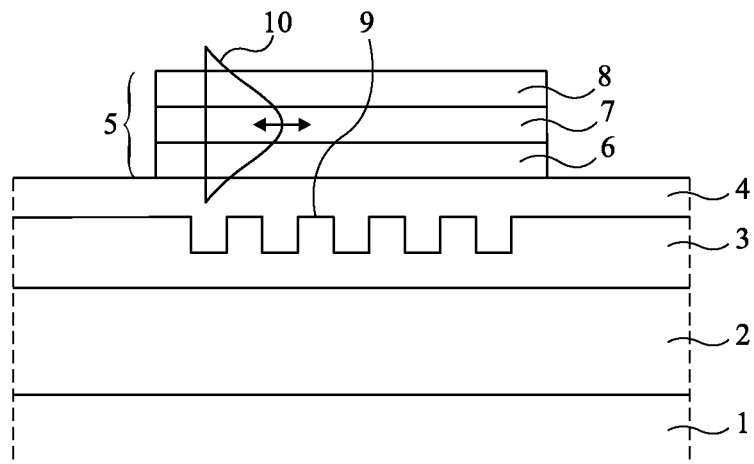
FIG. 1 is a cross-section view of a DFB laser structure formed by a III-V stack and an SOI waveguide in which the laser mode is guided by the III-V stack.
Figure 2:
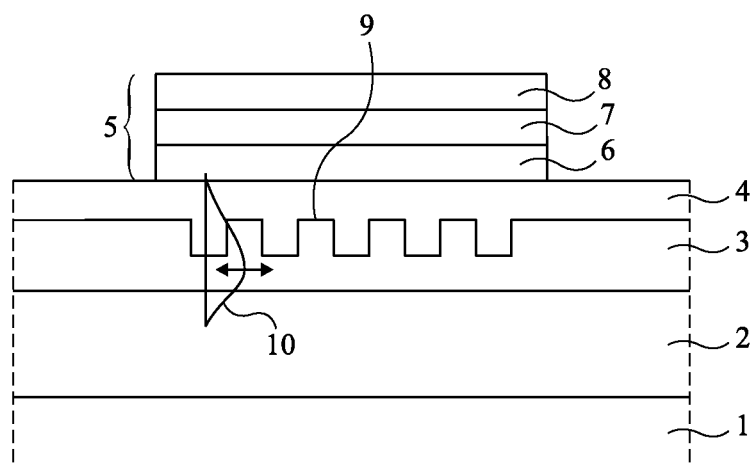
FIG. 2 is a cross-section view of a DFB laser structure formed by a III-V stack and an SOI waveguide in which the laser mode is guided by the SOI waveguide.
Figure 3:
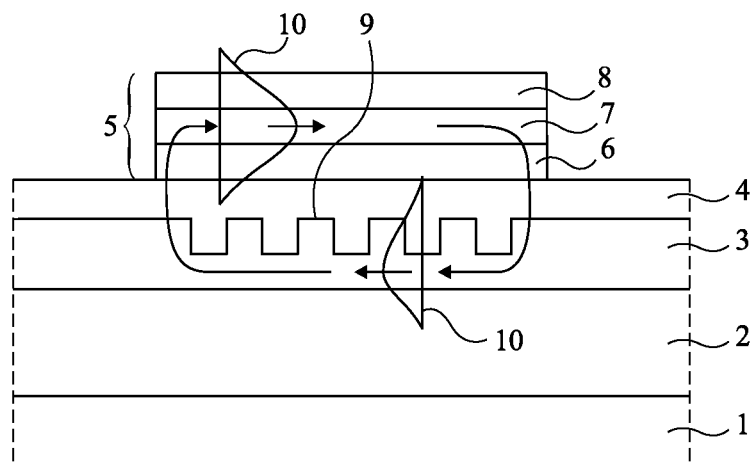
FIG. 3 is a cross-section view of a DFB laser structure formed by a III-V stack and an SOI waveguide in which the laser mode circulates in a loop from the III-V stack to the SOI waveguide.

As usual in the representation of integrated circuits, FIGS. 1, 2, and 3 are not to scale.

The present invention is based on an in-depth analysis of the coupling between a III-V multilayer stack and an SOI-type waveguide in the presence of a periodic variation of the index. Known structures may be classified in two categories.

Structures of the first category use an SOI waveguide of stronger effective index than the III-V stack. The laser mode is then mainly guided by the SOI guide and only its evanescent tail covers the gain area. This case is shown in FIG. 2.

This type of laser thus favors the efficiency of the power extraction into the SOI guide to the detriment of the gain in the III-V stack. The mode confinement factor in the gain area is very low and decreases exponentially with the distance between the laser and the guide. This implies that the laser state can only be reached with the use of a low bonding thickness. For example, results published in literature indicate that for an SOI guide having a 700-nm thickness, the confinement factor in quantum wells passes from 1% for a zero bonding interface thickness to 0.1% for 100 nm.

Given the index of the used materials, the SOI guide must be relatively thick (~700 nm) so that its effective index is greater than the effective index of the III-V guide. Such guides are bulky and, further, multimode. Changing to single-mode guides is not easy and takes up space on the circuit.

Conversely, structures of the second category use a III-V epitaxy of stronger effective index than the SOI waveguide. The laser mode is then mainly guided by the III-V structure and only its evanescent tail covers the SOI waveguide. This type of laser thus favors the gain to the detriment of the efficiency of power extraction towards the SOI guide. The extracted power is limited by the low fraction of the mode covering the SOI guide.

The two above structures have in common that the laser beam in the silicon layer propagates in the same direction as the laser beam in the III-V layer.

In addition to their low efficiency, these two structures have the disadvantage of having a low tolerance to thickness variations of interface layer 4, since the gain in the first case and the coupling rate in the second case decrease exponentially with the increase of the layer thickness.

Determination of the Contradirectional Coupling Between the III-V Stack and the SOI Waveguide The present inventors have shown that such disadvantages essentially result from the selection of the period of the grating enabling the laser operation. The present invention provides a device having a structural outlook similar to that of prior art shown in FIGS. 1 and 2, but in which the grating period is selected to generate a resonant contradirectional coupling between the eigenmode of the III-V stack and that of the SOI waveguide: the mode which propagates along the III-V stack is progressively coupled to the mode of the SOI guide propagating in the opposite direction, and conversely. This case is illustrated in FIG. 3. This coupling results in a continuous optical power exchange between the III-V stack and the SOI guide, resulting in a distributed feedback effect. The major advantage of this type of coupling is that the mode takes advantage from the gain on its area of highest amplitude while keeping a strong efficiency of extraction towards the SOI guide. Further, the coupling between the III-V stack and the SOI guide being of resonant type, the thickness of interface layer 4 is not highly critical. Conversely to previously-developed III-V on silicon DFB lasers, the grating is not only used to enable to recycle photons, but also to couple the eigenmodes of the two guides.

In FIG. 3, III-V stack 5 and the region of thin silicon layer 3 are considered. These two regions may be considered as two neighboring waveguides: a III-V gain waveguide, and a passive silicon waveguide. These two guides are buried in a cladding of lower optical index, such as silicon oxide $SiO_2$. The propagation constants of their eigenmodes are respectively noted βIII-V and βSOI. These constants are linked, for each waveguide, to the mode frequency by the following dispersion relation:

$$\frac{\omega}{c} d \sqrt{n_1^2 - \beta^2} - 2\mathrm{Arctan}\left(g \frac{\sqrt{\beta^2 - n_2^2}}{\sqrt{n_1^2 - \beta^2}}\right) = m\pi; \quad (1)$$

$$m = 0, 1, 2, \ldots$$

with:
- ω: mode frequency,
- β: propagation constant,
- d: guide height,
- $n_1$: optical index of the guide core (III-V or Si),
- $n_2$: optical index of the cladding ($SiO_2$),
- m: order of the considered mode (for the eigenmode, m=0).

Equation (1) is valid for TE modes and a similar equation exists for TM modes. The mode frequency is linked to the wavelength by relation ω=2πc/2λ, while the propagation constant is directly linked to the effective index by relation β=2π$n_{eff}$/λ.

Figure 4:
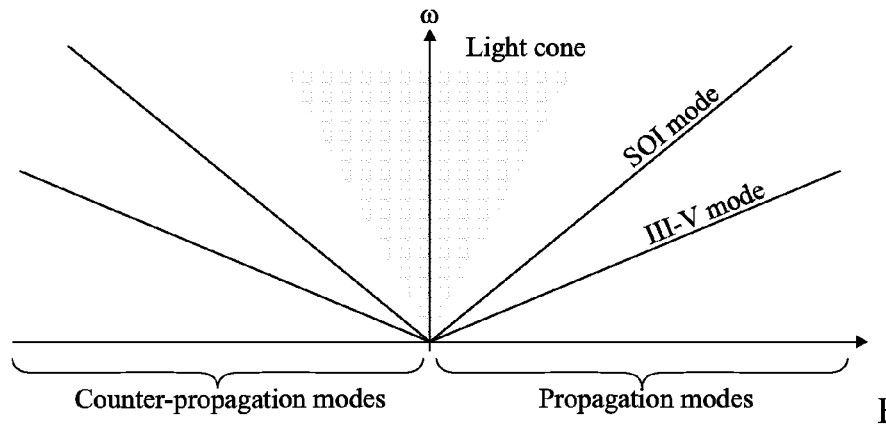
FIG. 4 illustrates dispersion curves ω(βIII-V) and ω(βSOI) in the absence of a periodic variation of the index.

A simplified representation of dispersion curves ω(βIII-V) and ω(βSOI) in the absence of a periodic variation of the index is provided in FIG. 4. The modes propagating in the positive direction can be distinguished from the modes propagating in the negative direction by the sign of the slope of dispersion curve ω(β). In other words, the modes having a dispersion curve ω(β) with a positive slope propagate in one direction while the modes having a negative slope propagate in the opposite direction.

According to the Floquet-Bloch theorem, when a periodic variation of the index is added to the system, an infinite number of spatial harmonics of the modes are created every integral multiple of 2π/a (a being the grating period). Theoretical dispersion curves ω(βIII-V) and ω(βSOI) in the presence of a grating etched in the silicon guide are schematized in FIG. 5. The first Brillouin zone between −π/a and π/a contains all the possible system states (all the outer states find their equivalents therein), so the analysis of problem can be limited to the analysis of this area.

Figure 5:
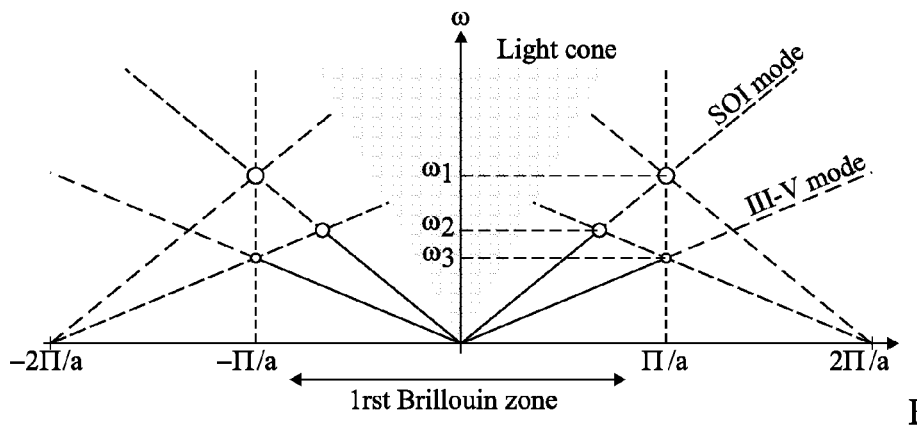
FIG. 5 illustrates theoretical dispersion curves ω(βIII-V) and ω(βSOI) in the presence of a periodic variation of the index.

The anti-crossing points correspond to resonant coupling points associated with a band gap opening. This band gap opening is all the larger as the coupling is strong. In FIG. 5, three distinct coupling frequencies can be distinguished, that is, ω1, ω2, and ω3.

At frequencies ω1 and ω3, the following Bragg conditions are satisfied:

$$2\beta_{III-V}(\omega_3) = 2n\pi/a \quad (2)$$

$$2\beta_{SOI}(\omega_1) = 2n\pi/a, \quad (3)$$

n being an integer.

Such conditions respectively correspond to the III-V/III-V and SOI/SOI contradirectional couplings of "direct Bragg" type respectively shown in FIGS. 1 and 2: the mode which propagates in a direction in one of the two guides transfers its power to the same mode which propagates in the opposite direction. The electromagnetic wave is thus reflected with no power exchanges between the two guides.

This type of coupling is used in the design of prior art DFB lasers.

At frequency ω2, the following condition is fulfilled:

$$\beta_{SOI}(\omega_2) + \beta_{III-V}(\omega_2) = 2n\pi/a \quad (4)$$

where: n is an integer, and $$\beta_{SOI}(\omega_2) \neq \beta_{III-V}(\omega_2) \quad (5)$$

Equation (4) corresponds to the III-V/SOI "Bragg exchange" type contradirectional coupling shown in FIG. 3. The mode which propagates in one direction in the first guide transfers its power to the mode which propagates in the opposite direction in the second guide.

Thus, the grating period is here selected so that frequency ω2 is in the gain spectrum of the active III-V material. At this specific frequency, the optical field must circulate in a loop from the III-V guide to the SOI guide. This circulation phenomenon, in addition to providing distributed feedback, enables the mode to benefit from the gain on its area of highest amplitude while ensuring a high efficiency of power extraction towards the SOI guide. It should be noted that the fact of having $\beta_{III-V} < \beta_{SOI}$ or $\beta_{III-V} > \beta_{SOI}$ in the working frequency range does not modify equation (4) and thus does not change the operating principle of the laser.

According to the coupled-mode theory, the contradirectional coupling force is provided by coupling constant κ, which may be analytically calculated by means of the following relation:

$$\kappa = \frac{\omega \varepsilon_0}{4} \int\int \Delta \varepsilon \Psi_{III-V} \Psi_{SOI} dx dy. \quad (5)$$

The propagation is oriented along axis z. $\Psi_{III-V}$ and $\Psi_{SOI}$ are the wave functions of the III-V and SOI eigenmodes. These wave functions determine the field profile of the modes and are calculated by solving the Maxwell equations. Function Δε is a Fourier series defining the periodic variation of the index:

$$\Delta \varepsilon(x, y, z) = \sum_{m \neq 0} \Delta \varepsilon_m(x, y) \exp\left(-jm\frac{2\pi}{a}z\right). \quad (6)$$

By drawing the dispersion curves of the modes supported by the complete device by means of a calculation algorithm such as the RCWA (Rigorous Coupled-Wave Analysis), it is also possible to deduce the coupling constant from the band gap opening by means of the following equation:

$$\Delta u = \frac{a}{2\pi} \frac{4\kappa}{n_{gIII-V} + n_{gSOI}}. \quad (7)$$

with:
Δu: band gap opening (a/λ units),
a: grating period,
κ: contradirectional coupling constant,
ngIII-V and ngSOI: group indexes of the III-V and SOI modes.

The group indexes of the modes may be simply calculated by means of relation ng=c/vg, where vg is the group speed and corresponds to the slope of the dispersion curve.

In the case of a laser operating on a "Bragg exchange" type coupling, the reflectivity according to the coupling constant and to the laser length is provided by:

$$R = \tanh^2(2\kappa L). \quad (8)$$

The laser length will thus be selected according to the coupling constant and according to the desired reflectivity by means of equation (8).

Structure Optimization

A parasitic coupling phenomenon, the directional coupling, must be considered to optimize the dimensions of the III-V and SOI guides, as well as the grating etch depth. The directional coupling corresponds to the power transfer between two different guide modes propagating in the same direction. The directional coupling efficiency is provided by the coupled-mode theory, by the following relation:

$$F = \frac{1}{1 + \left(\frac{\Delta_{dir}}{\kappa_{dir}}\right)^2}. \quad (9)$$

Phase detuning Δdir is linked to the difference between the propagation constants of the eigenmodes according to the following relation:

$$\Delta_{dir} = \frac{\beta_{III-V} - \beta_{SOI}}{2}. \quad (10)$$

Directional coupling constant κdir determines the strength of the directional coupling and is analytically calculated by means of the following relations:

$$\kappa_{dir} = \sqrt{\kappa_{III-V/Si} \times \kappa_{Si/III-V}}. \quad (11)$$

$$\kappa_{III-V/Si} = \frac{\omega \varepsilon_0}{4} \int\int_\infty [n_2^2(x, y) - n_{Si}^2(x, y)] \Psi_{III-V} \Psi_{SOI} dx dy. \quad (12)$$

-continued $$\kappa_{Si/III-V} = \frac{\omega\varepsilon_0}{4} \int \int_\infty [n_2^2(x, y) - n_{III-V}^2(x, y)]\Psi_{III-V}\Psi_{SOI}\,dx\,dy. \quad (13)$$

where n2 is the optical index of the cladding.

The directional coupling is a limiting factor of the contra-directional coupling. An optimized structure must thus minimize directional coupling efficiency F. The steps to be taken thus are to draw function F(Δdir, κdir) for several bonding interface thicknesses and grating etch depths, and then to determine what SOI guide height will be appropriate for a given III-V epitaxy. The III-V and SOI guides being potentially multimode, these steps must be repeated for all possible directional couplings between the different modes.

The optical losses in SOI waveguide 3 at the transition between the area structured by grating 9 and the unstructured area may be decreased by a progressive adaptation of the grating filling factor in the vicinity of the transition.

On the other hand, adding a progressive variation of one of the dimensions of the SOI guide or of the III-V guide (funnel-shaped adiabatic transition) on either side of the device, beyond the area structured by the grating, enables to transfer the photons guided by the III-V stack to the SOI guide, to increase the output power.

Finally, DFB lasers are known to have a dual-mode emission (two close emission wavelengths), but the addition of a defect (commonly called quarter-wave plate) enables to break the grating symmetry and to force the single-mode emission of the laser.

Example of Embodiment

An example of sizing of an embodiment enabling to achieve the aims of the present invention is indicated hereafter as an example only.

III-V epitaxy of a thickness ranging between 600 nm and 2 μm and of effective index ranging between 2.5 and 3.2. The epitaxy is a laser stack for example originating from the family of InP or GaAs and their respective alloys. It comprises an active light-emitting area containing one or several quantum wells. The active area is comprised in the i area of a p-i-n junction to enable the electric pumping of the laser. The gain spectrum of the structure is for example centered on a 1.5-μm wavelength.

SOI waveguide of a thickness ranging between 220 nm and 700 nm, etched down to a thickness ranging between 20 nm and 100 nm, of effective index ranging between 2 and 3.4. As a variation, the grating may be etched in a layer of a material other than silicon (for example, silicon nitride) deposited at the surface of the SOI guide.

Distance between the two guides (corresponding to the thickness of the bonding interface) ranging between 50 and 250 nm, with an interface material having an index on the order of 1.45. The material used usually is silica, $SiO_2$, or a polymer adapted to an adhesive-type bonding. In the context of the present invention, it may also be ITO, MN, nanocrystals . . . . A constraint is for the material to be relatively transparent in the targeted wavelength range (here, the infrared range currently used for telecommunications, from 1.3 μm to 1.55 μm).

Effective indexes of the two waveguides and distance separating them selected so that the directional coupling efficiency provided by equation (9) is minimized at the work wavelength.

Grating period set by the relation of equation (4) according to the emission wavelength and to the effective indexes of the III-V and SOI guides.

Laser length advantageously ranging between 100 μm and 1 mm according to the selected bonding thickness.

Figure 6:
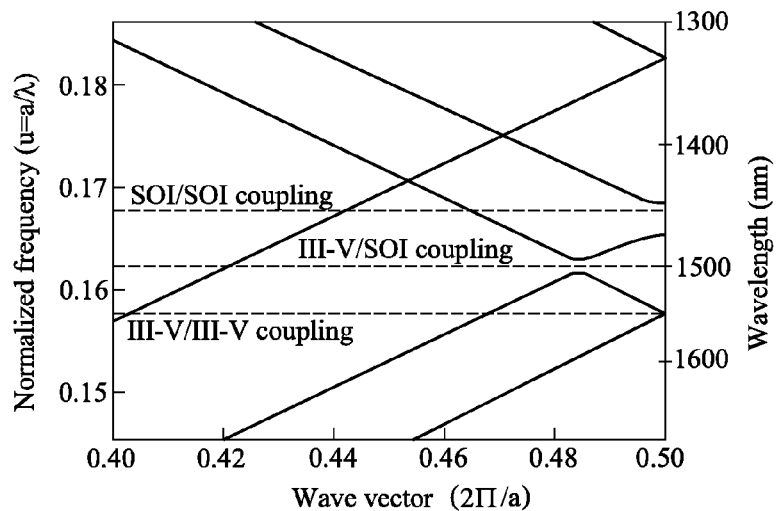
FIG. 6 illustrates a dispersion diagram.

The following calculations are performed for a structure formed of a III-V stack with a 600-nm thickness and an SOI waveguide with a 260-nm thickness comprising at its surface a grating etched down to 40 nm. At a 1.5 μm wavelength, the effective indexes of these two waveguides respectively are 3.16 and 2.99. The waveguides are separated by a bonding layer having a 100-nm thickness. The dispersion diagram of the structure provided in FIG. 6 is calculated by an RCWA-type calculation algorithm. The band gap opening corresponding to the Bragg exchange III-V/SOI coupling appears at a normalized frequency u (a/λ) of 0.162 (that is, λ=1500 nm). The direct Bragg III-V/III-V and SOI/SOI couplings appear at normalized frequencies u=0.158 (that is, λ=1544 nm) and u=0.168 (that is, λ=1452 nm), respectively. By measuring the opening of the band gap centered on 1500 nm, coupling constant κ is calculated by means of equation (7) and it is found to be equal to 39.5 $mm^{-1}$. By using equation (8), it is calculated that a laser having a length of no more than 100 μm will be necessary to obtain a 93% grating reflectivity. The same calculations, repeated over a structure using a 200-nm bonding thickness show that a laser having a length of no more than 300 μm will be necessary to obtain an equivalent reflectivity.

An optical simulation performed by the present inventors provides the following results. The power detected in the III-V guide is more than ten times greater at the III-V/SOI coupling frequency than at the SOI/SOI frequency. The laser effect at this last frequency is thus improbable due to the low gain of the mode. On the contrary, at the III-V/SOI coupling frequency, the field is homogeneously shared between the HI-V and SOI guides, which allows both a large amount of gain and a strong efficiency of extraction towards the SOI guide.

ADVANTAGES OF THE INVENTION

The structure described herein thus enables:
for the mode to benefit from the gain on its area of highest amplitude while keeping a strong efficiency of power extraction towards the SOI guide,
to slacken the constraints on the bonding thickness, and thus to ease the technological integration since the coupling is of resonant type (simulations show that a bonding thickness of more than 200 nm may be used),
to keep a silicon waveguide thickness ranging between 200 and 300 nm,
to have a large coupling constant and thus a short laser (<500 nm),
to have a longitudinal (and possibly transverse) single-mode laser with the use of a quarter wave plate. Specific embodiments of the present invention have been described. Various alterations and modifications will occur to those skilled in the art. In particular, all the numerical indications have been indicated as an example only.

To accurately control the grating height, it is possible to etch the grating, not in the silicon, but at the surface of another material deposited on the silicon for a selective etch stop. This other material may be SiGe or SiN.

A specific advantage of the device described herein is that the laser emission wavelength variation with a variation of the grating filling factor is approximately twice smaller than in prior art devices. With an accurate control of the grating filling factor, it is possible, with this device, to form a large number of lasers side by side, emitting at very close wavelengths, on a same wafer. This implementation mode is very advantageous for wavelength-division multiplexed systems (WDM).

The invention claimed is:

1. A method for introducing light into a waveguide (3) formed on the upper surface of a microelectronics substrate, by means of a distributed feedback laser device formed by the association of an SOI-type structure having a portion forming said waveguide (3), of a stack of III-V semiconductor gain materials (5) partially covering the waveguide (3), and of an optical grating (9), wherein the grating step is selected so that the optical power of the laser beam circulates in a loop from the III-V stack (5) to the waveguide (3), and wherein the grating step is selected so that:

$$\beta_{SOI}(\omega_2)+\beta_{III\text{-}V}(\omega_2)=2n\pi/a, \text{ and}$$

$$\beta_{SOI}(\omega_2)\neq\beta_{III\text{-}V}(\omega_2)$$

with:
a: grating step,
$\omega_2$: mode frequency,
$\beta_{SOI}$: propagation constant in the waveguide,
$\beta_{III\text{-}V}$: propagation constant in said stack,
n: an integer.

2. The method of claim 1, wherein the grating length is selected so that:

$$R=\tanh^2(2\kappa L)$$

with:
L: grating length,
κ: contradirectional coupling constant,
R: grating reflectivity
so that R ranges between 0.60% and 0.99%.

3. A distributed feedback laser device formed by the association of an SOI-type structure having a portion forming a waveguide (3), of a stack of III-V semiconductor gain materials (5) partially covering the waveguide (3), and of an optical grating (9) having its period selected to allow a loop circulation of the optical power from the III-V stack (5) to the waveguide (3), wherein the grating step is selected so that:

$$\beta_{SOI}(\omega_2)+\beta_{III\text{-}V}(\omega_2)=2n\pi/a, \text{ and}$$

$$\beta_{SOI}(\omega_2)\neq\beta_{III\text{-}V}(\omega_2)$$

with:
a: grating step,
$\omega_2$: mode frequency,
$\beta_{SOI}$: propagation constant in the waveguide,
$\beta_{III\text{-}V}$: propagation constant in said stack,
n: an integer.

4. The device of claim 3, wherein the grating is formed of periodic recesses dug into the upper surface of a silicon waveguide clad with silicon oxide.

5. The method of claim 3, wherein the grating length is selected so that:

$$R=\tanh^2(2\kappa L)$$

with:
L: laser length,
κ: contradirectional coupling constant,
R: grating reflectivity
so that R ranges between 0.60% and 0.99%.

* * * * *